(12) United States Patent
Ono et al.

(10) Patent No.: US 8,617,311 B2
(45) Date of Patent: Dec. 31, 2013

(54) SILICON SINGLE CRYSTAL WAFER FOR IGBT AND METHOD FOR MANUFACTURING SILICON SINGLE CRYSTAL WAFER FOR IGBT

(75) Inventors: Toshiaki Ono, Tokyo (JP); Shigeru Umeno, Tokyo (JP); Wataru Sugimura, Tokyo (JP); Masataka Hourai, Tokyo (JP)

(73) Assignee: Sumco Corporation (JP)

( * ) Notice: Subject to any disclaimer, the term of this patent is extended or adjusted under 35 U.S.C. 154(b) by 1741 days.

(21) Appl. No.: 11/708,771

(22) Filed: Feb. 20, 2007

(65) Prior Publication Data

US 2007/0193501 A1    Aug. 23, 2007

(30) Foreign Application Priority Data

Feb. 21, 2006  (JP) ................................ 2006-043572
Feb. 15, 2007  (JP) ................................ 2007-034536

(51) Int. Cl.
*C30B 15/04*       (2006.01)

(52) U.S. Cl.
USPC .................... 117/13; 117/15; 117/16; 117/20; 117/932

(58) Field of Classification Search
USPC ....................... 117/81–87, 12, 15, 16, 20, 932
See application file for complete search history.

(56) References Cited

U.S. PATENT DOCUMENTS 5,931,662 A * 8/1999 Adachi et al. ...................... 432/6
6,074,479 A * 6/2000 Adachi et al. ................. 117/204
6,117,231 A   9/2000 Fusegawa et al.

(Continued)

FOREIGN PATENT DOCUMENTS

CN        1200559    12/1998
CN        16924812   11/2005

(Continued)

OTHER PUBLICATIONS

Korean Office Action from corresponding Korean Patent Application No. 10-2007-0016616 issued on Mar. 31, 2008.

(Continued)

*Primary Examiner* — Bob M Kunemund (74) *Attorney, Agent, or Firm* — Kolisch Hartwell, P.C.

(57) ABSTRACT

In this silicon single crystal wafer for IGBT, COP defects and dislocation clusters are eliminated from the entire region in the radial direction of the crystal, the interstitial oxygen concentration is $8.5 \times 10^{17}$ atoms/cm$^3$ or less, and variation in resistivity within the wafer surface is 5% or less. This method for manufacturing a silicon single crystal wafer for IGBT includes introducing a hydrogen atom-containing substance into an atmospheric gas at a hydrogen gas equivalent partial pressure of 40 to 400 Pa, and growing a single crystal having an interstitial oxygen concentration of $8.5 \times 10^{17}$ atoms/cm$^3$ or less at a silicon single crystal pulling speed enabling pulling of a silicon single crystal free of grown-in defects. The pulled silicon single crystal is irradiated with neutrons so as to dope with phosphorous; or an n-type dopant is added to the silicon melt; or phosphorous is added to the silicon melt so that the phosphorous concentration in the silicon single crystal is $2.9 \times 10^{13}$ to $2.9 \times 10^{15}$ atoms/cm$^3$ and a p-type dopant having a segregation coefficient smaller than that of the phosphorous is added to the silicon melt so that the concentration in the silicon single crystals is $1 \times 10^{13}$ to $1 \times 10^{15}$ atoms/cm$^3$ corresponding to the segregation coefficient thereof.

6 Claims, 2 Drawing Sheets

(56) References Cited

U.S. PATENT DOCUMENTS

| | | | |
|---|---|---|---|
| 6,245,161 B1 | 6/2001 | Henley et al. | |
| 6,277,501 B1* | 8/2001 | Fujikawa | 428/641 |
| 6,284,384 B1* | 9/2001 | Wilson et al. | 428/450 |
| 6,300,680 B1 | 10/2001 | Horikawa et al. | |
| 6,339,016 B1* | 1/2002 | Torack et al. | 438/584 |
| 6,413,310 B1* | 7/2002 | Tamatsuka et al. | 117/3 |
| 6,428,619 B1 | 8/2002 | Koya et al. | |
| 6,537,655 B2* | 3/2003 | Wilson et al. | 428/310.5 |
| 6,599,815 B1* | 7/2003 | Yang | 438/471 |
| 6,663,708 B1* | 12/2003 | Morita et al. | 117/3 |
| 6,666,915 B2* | 12/2003 | Yang et al. | 117/3 |
| 6,682,597 B2 | 1/2004 | Koya et al. | |
| 6,818,569 B2* | 11/2004 | Mun et al. | 438/799 |
| 6,958,092 B2* | 10/2005 | Wilson et al. | 117/23 |
| 7,067,005 B2 | 6/2006 | Shibayama et al. | |
| 7,201,800 B2 | 4/2007 | Mule'Stagno et al. | |
| 7,214,267 B2* | 5/2007 | Kato | 117/13 |
| 7,273,647 B2* | 9/2007 | Nishikawa et al. | 428/64.1 |
| 7,300,517 B2* | 11/2007 | Sugimura et al. | 117/19 |
| 7,306,676 B2* | 12/2007 | Sugimura et al. | 117/208 |
| 7,316,745 B2* | 1/2008 | Sadamitsu et al. | 117/20 |
| 7,320,731 B2* | 1/2008 | Ono et al. | 117/20 |
| 7,344,689 B2* | 3/2008 | Umeno et al. | 423/328.2 |
| 7,364,618 B2* | 4/2008 | Hourai et al. | 117/20 |
| 7,374,741 B2* | 5/2008 | Ono et al. | 423/328.2 |
| 7,384,480 B2* | 6/2008 | Sugimura et al. | 117/208 |
| 7,435,294 B2* | 10/2008 | Ono et al. | 117/19 |
| 7,563,319 B2 | 7/2009 | Umeno et al. | |
| 7,628,854 B2* | 12/2009 | Ono et al. | 117/30 |
| 7,637,997 B2* | 12/2009 | Ono et al. | 117/15 |
| 7,700,394 B2* | 4/2010 | Sadamitsu et al. | 438/45 |
| 2001/0007240 A1 | 7/2001 | Dietze et al. | |
| 2001/0023941 A1 | 9/2001 | Ammon et al. | |
| 2001/0032581 A1* | 10/2001 | Wilson et al. | 117/20 |
| 2003/0051656 A1* | 3/2003 | Yang et al. | 117/3 |
| 2003/0051660 A1 | 3/2003 | Koya et al. | |
| 2003/0056715 A1 | 3/2003 | Tachikawa et al. | |
| 2003/0148634 A1 | 8/2003 | Holzl et al. | |
| 2003/0159650 A1* | 8/2003 | Yang et al. | 117/89 |
| 2004/0009111 A1 | 1/2004 | Haga et al. | |
| 2004/0065250 A1 | 4/2004 | Komiya et al. | |
| 2004/0069214 A1* | 4/2004 | Choi et al. | 117/213 |
| 2004/0194692 A1* | 10/2004 | Nishikawa et al. | 117/84 |
| 2005/0032337 A1* | 2/2005 | Wilson et al. | 438/476 |
| 2005/0098092 A1* | 5/2005 | Wilson et al. | 117/84 |
| 2005/0229842 A1* | 10/2005 | Umeno et al. | 117/84 |
| 2005/0250349 A1* | 11/2005 | Sadamitsu et al. | 438/800 |
| 2005/0252442 A1* | 11/2005 | Kato | 117/13 |
| 2006/0027159 A1 | 2/2006 | Shibayama et al. | |
| 2006/0038206 A1* | 2/2006 | Shimoyama et al. | 257/273 |
| 2006/0121692 A1 | 6/2006 | Shiota et al. | |
| 2006/0121696 A1 | 6/2006 | Shiota et al. | |
| 2006/0156969 A1* | 7/2006 | Hourai et al. | 117/89 |
| 2006/0225639 A1 | 10/2006 | Ono et al. | |
| 2007/0000427 A1* | 1/2007 | Umeno et al. | 117/3 |
| 2007/0017433 A1 | 1/2007 | Sakurada et al. | |
| 2007/0113778 A1 | 5/2007 | Komiya et al. | |
| 2007/0140828 A1 | 6/2007 | Iga et al. | |
| 2007/0169688 A1 | 7/2007 | Yoon et al. | |
| 2007/0186845 A1 | 8/2007 | Umeno | |
| 2007/0193501 A1* | 8/2007 | Ono et al. | 117/13 |
| 2008/0102287 A1* | 5/2008 | Umeno et al. | 428/447 |

FOREIGN PATENT DOCUMENTS

| | | |
|---|---|---|
| EP | 0170856 | 2/1986 |
| EP | 1513193 | 3/2005 |
| EP | 1 598 452 A1 | 11/2005 |
| EP | 1811065 | 7/2007 |
| JP | 61-024240 | 2/1986 |
| JP | 61-36197 | 2/1986 |
| JP | 61114537 | 6/1986 |
| JP | 62-202528 | 9/1987 |
| JP | 62-257723 | 11/1987 |
| JP | 05-043384 | 2/1993 |
| JP | 05074784 | 3/1993 |
| JP | 07-038102 | 2/1995 |
| JP | 08-203912 | 8/1996 |
| JP | 10-055975 | 2/1998 |
| JP | 10-098047 | 4/1998 |
| JP | 10-275812 | 10/1998 |
| JP | 2000-007486 | 1/2000 |
| JP | 2000-053497 | 2/2000 |
| JP | 2001-146496 | 5/2001 |
| JP | 2001-146498 | 5/2001 |
| JP | 2002-029891 | 1/2002 |
| JP | 2002-057159 | 2/2002 |
| JP | 2002-128591 | 5/2002 |
| KR | 1999-87977 | 12/1999 |
| KR | 1999-0087977 | 12/1999 |
| KR | 2001-31444 | 4/2001 |
| KR | 2001-0031444 | 4/2001 |
| TV | I236506 | 7/2005 |
| TW | I247058 | 1/2006 |
| WO | 03/056621 A1 | 7/2003 |
| WO | 2004073057 | 8/2004 |
| WO | 2004/083496 | 9/2004 |
| WO | 2004/083496 A1 | 9/2004 |
| WO | 2005/001171 A1 | 1/2005 |
| WO | 2005108656 A1 | 11/2005 |

OTHER PUBLICATIONS

Notice of Preliminary Rejection from related Korean Patent Application No. 10-2007-0016616, issued Sep. 30, 2008.

European Patent Office, European Search Report, European Patent Application No. EP 06011724.9; search completion date: Aug. 14, 2009.

Patent Office of the People's Republic of China, Office Action, Chinese Patent Application No. 200610105541.6; mailed Apr. 4, 2008.

Takasu, S. et al.,"Neutron Transmuted Magnetic Czochralski Grown Silicon Wafer for Power Device," Power Electronics Specialists Conference, 1988; PESC '88 Record, 19th Annual IEEE, Apr. 11-14, 1988 vol. 2, pp. 1339-1345.

Japanese Patent Office, Office action dated Jan. 4, 2011 in connection with related Japanese Application No. 2005-169929, 6 pgs.

Office Action dated Dec. 3, 2010 in connection with related Taiwanese Patent Application No. 096106183.

Japanese Patent Office, Notice of Reasons for Rejection, Japanese Patent Application No. 2007-034536 (related counterpart application); report completion date: Nov. 9, 2010; report mailing date: Nov. 16, 2010.

European Search Report dated Feb. 18, 2011 in connection with related application No. 07003441.8.

U.S. Patent and Trademark Office, Office action corresponding to related U.S. Appl. No. 12/847,928, dated Dec. 28, 2011, 33 pages.

U.S. Patent and Trademark Office, Final Office Action in connection with corresponding U.S. Appl. No. 12/847,928, Jun. 21, 2012, 17 pages.

* cited by examiner

SILICON SINGLE CRYSTAL WAFER FOR IGBT AND METHOD FOR MANUFACTURING SILICON SINGLE CRYSTAL WAFER FOR IGBT

BACKGROUND OF THE INVENTION

1. Field of the Invention

The present invention relates to a silicon single crystal wafer for IGBT used in the production of insulated gate bipolar transistors (IGBT), and a method for manufacturing a silicon single crystal wafer for IGBT.

The present application claims priority from Japanese Patent Application No. 2006-043572, filed on Feb. 21, 2006 and Japanese Patent Application No. 2007-034536, filed on Feb. 15, 2007, the contents of which are incorporated herein by reference.

2. Background Art

Insulated gate bipolar transistors (IGBT) are gate voltage-driven switching devices suitable for controlling high levels of electrical power, and are used in applications such as the inverters of trains, hybrid vehicles, air-conditioning equipment and refrigerators. IGBT are provided with three electrodes consisting of an emitter, a collector and a gate, and as a result of applying a voltage to the gate formed on the front surface of the device through an insulating oxide film, current between the emitter on the front surface of the device and the collector on the rear surface is controlled.

As described above, since IGBT are devices for controlling current with a gate insulated with an oxide film, the integrity of the gate oxide film (referred to as gate oxide integrity and abbreviated as GOI) is important. If a defect is contained in a silicon single crystal wafer, that defect ends up being incorporated into the gate oxide film, thereby causing a dielectric breakdown of the oxide film.

In addition, since IGBT are not devices that use only the vicinity of the wafer surface in the horizontal direction in the manner of memory devices and other LSI, but rather devices that use the wafer in the vertical direction, the characteristics thereof are affected by the bulk quality of the wafer. Recombination lifetime and resistivity are particularly important qualities. Since recombination lifetime decreases due to the presence of crystal defects in a wafer, it is important to control the device process so that crystal defects do not occur at any point in the process. Uniformity and stability are required for resistivity, and it is important that resistivity does not change within a wafer surface or between wafers, namely that resistivity is uniform even in the direction of length of silicon ingots and does not change through the device heating process.

In addition, epitaxial wafers (referred to as epiwafers) are used as wafers for so-called punch through (PT) type IGBT in which a depletion layer contacts the collector side when current flow is off. However, PT-type IGBT have the problem of high cost due to the use of epiwafers. In addition, switching loss increases at high temperatures to control lifetime. Consequently, on-voltage decreases at high temperatures and current concentrates in a specific device during parallel use, thereby causing damage.

In order to overcome the shortcomings of PT-type wafers, non-punch-through (NPT) type IGBT have been developed in which the depletion layer does not contact the collector side when the current is off. More recently, field stop (FS) IGBT are being produced having lower on voltage and lower switching loss by employing a trench gate structure and forming an FS layer on the collector side. Wafers having a diameter of 150 mm or less cut out from silicon single crystals grown by the FZ method (referred to as FZ wafers) have conventionally been used as wafers for NPT-type and FS-type IGBT.

Although FZ wafers are less expensive than epiwafers, wafers are required to have a large diameter in order to further lower IGBT production costs. However, it is extremely difficult to grow single crystals having a diameter larger than 150 mm by the FZ method, and even if they were able to be produced, it would be difficult to provide them at a low price and in stable supply.

Therefore, we attempted to manufacture a silicon single crystal wafer for IGBT by the Czochralski method (CZ method) capable of easily growing large-diameter crystals.

Each of the technologies described in the following Patent Documents 1 to 3 explained below are used for the purpose of reducing defects within wafers. Patent Document 1 discloses a silicon single crystal wafer doped with nitrogen in which the entire surface is composed of an N region and the interstitial oxygen concentration is 8 ppma or less, or doped with nitrogen in which at least void defects and dislocation clusters have been eliminated from the entire surface and the interstitial oxygen concentration is 8 ppma or less.

In addition, Patent Document 2 discloses a method for manufacturing a silicon single crystal which is pulled using the Czochralski method during doping with oxygen and nitrogen, wherein the single crystal is doped with oxygen at a concentration of less than $6.5 \times 10^{17}$ atoms/cm$^3$ and nitrogen at a concentration of more than $5 \times 10^{13}$ atoms/cm$^3$ during pulling.

Moreover, Patent Document 3 discloses a silicon semiconductor substrate grown from a melt containing nitrogen using the Czochralski method, containing nitrogen at a concentration of $2 \times 10^{14}$ to $2 \times 10^{16}$ atoms/cm$^3$ and oxygen at a concentration of $7 \times 10^{17}$ atoms/cm$^3$ or less in which each type of surface defect density is such that FPD$\leq$0.1 defect/cm$^2$, SEPD$\leq$0.1 defect/cm$^2$ and OSF$\leq$0.1 defect/cm$^2$, the internal defect density is such that LSTD$\leq$1$\times$10$^5$ defects/cm$^2$, and the gate oxide integrity characteristics are such that the TZDB high C mode pass rate$\geq$90% and the TDDB pass rate$\geq$90%.

However, although methods for manufacturing wafers free of crystal defects are disclosed in Patent Documents 1 to 3, the wafer characteristics required by IGBT are not clearly indicated. In addition, since it was necessary to make considerable changes to the rotating speed of the quartz crucible and rotating speed of the crystal from the conditions of the prior art in order to grow crystals with defect-free CZ silicon in which the interstitial oxygen concentration was $7 \times 10^{17}$ atoms/cm$^3$ or less and the variation in the resistivity within a wafer surface was 5% or less, the margin of the pulling speed enabling growth of defect-free crystals became smaller, thereby resulting in the problem of decreased yield.

In consideration of the aforementioned circumstances, an object of the present invention is to provide a method for manufacturing a silicon single crystal wafer for IGBT and a silicon single crystal wafer for IGBT that enables the margin of the pulling speed to be increased while also enabling the production of wafers having little variation in resistivity.

Patent Document 1: Japanese Unexamined Patent Application, First Publication No. 2001-146496

Patent Document 2: Japanese Unexamined Patent Application, First Publication No. 2000-7486

Patent Document 3: Japanese Unexamined Patent Application, First Publication No. 2002-29891

SUMMARY OF THE INVENTION

When silicon single crystal wafers are produced according to the Czochralski method (CZ method), although it is possible to produce large-diameter wafers having a diameter of about 300 mm, wafers produced using the CZ method were not suitable for wafers for IGBT for the reasons indicated below.

(1) In the CZ method, excess voids aggregate during single crystal growth resulting in the formation of crystal-originated particles (COP) of about 0.2 to 0.3 μm. During production of IGBT, a gate oxide film is formed on the wafer surface, and if pits formed by exposure of COP defects on the wafer surface or COP defects present in the vicinity of the wafer surface are incorporated in this gate oxide film, gate oxide integrity (GOI) becomes inferior. Thus, although wafers that do not contain COP defects are required to prevent inferior GOI, it is difficult to manufacture defect-free wafers by the CZ method.

(2) Silicon single crystal wafers produced by the CZ method contain excess oxygen of about $1 \times 10^{18}$ atoms/cm$^3$, and when low-temperature heat treatment for about 1 hour at 450° C. (heat treatment equivalent to sintering treatment in the IGBT production process) is carried out on such wafers, oxygen donors are generated resulting in a difference in wafer resistivity before and after heat treatment.

(3) The resistivity of silicon single crystal wafers produced by the CZ method can be controlled according to the amount of dopant added to the silicon melt, and although dopant in the form of phosphorous is added to wafers for IGBT, due to the small segregation coefficient of phosphorous, the concentration changes drastically in the lengthwise direction of the silicon single crystal. Consequently, the range in which wafers having a resistivity that complies with design specifications within a single silicon single crystal is narrow.

(4) Silicon single crystal wafers produced by the CZ method contain excess oxygen of about $1 \times 10^{18}$ atoms/cm$^3$, and when a device formation process is carried out on such wafers, the excess oxygen precipitates as $SiO_2$ thereby causing the wafer to have an inferior recombination lifetime.

As a result of conducting extensive studies to solve the problems described in (1) to (4) above, the inventors of the present invention found that a wafer provided with wafer characteristics required by IGBT can be produced by the CZ method by employing the constitution described below.

A silicon single crystal wafer for IGBT of the present invention includes a silicon single crystal grown by the Czochralski method, wherein, COP defects and dislocation clusters are eliminated from the entire region in the radial direction of the crystal, the interstitial oxygen concentration is $8.5 \times 10^{17}$ atoms/cm$^3$ or less, and variation in resistivity within the wafer surface is 5% or less.

In the silicon single crystal wafer for IGBT of the present invention, the silicon single crystal may be grown at a pulling speed that allows pulling of silicon single crystal free of grown-in defects when grown by the Czochralski method, and may be doped with phosphorous by carrying out neutron irradiation on the silicon single crystal after pulling.

The silicon single crystal may be grown from a silicon melt doped with an n-type dopant at a pulling speed enabling pulling of silicon single crystal free of grown-in defects during growth by the Czochralski method.

The silicon single crystal may be doped with nitrogen at $1 \times 10^{14}$ atms/cm$^3$ to $5 \times 10^{15}$ atoms/cm$^3$.

The TZDB pass rate in a disruptive electric field of 8 MV/cm may be 90% or more, the concentration of oxygen donors generated in the case of carrying out heat treatment at 450° C. for 1 hour may be $6 \times 10^{12}$ donors/cm$^3$ or less, the density of BMD precipitating in the case of carrying out two-stage heat treatment including heating at 800° C. for 4 hours and heating at 1000° C. for 16 hours may be $5 \times 10^7$ cm$^{-3}$ or less, and the recombination lifetime in the case of carrying out the same two-stage heat treatment may be 100 μsec or more.

The silicon single crystal may be doped with phosphorous and a p-type dopant having a smaller segregation coefficient than that of phosphorous contained at a concentration of $1 \times 10^{13}$ to $1 \times 10^{15}$ atoms/cm$^3$, respectively.

The LPD density in the wafer surface may be 1 defect/cm$^2$ or less, and the light etching defect density may be $1 \times 10^3$ defects/cm$^2$ or less.

A polycrystalline silicon layer of 50 to 1000 nm may be formed on the rear side.

Furthermore, in the present invention, variation in resistivity refers to the value obtained by measuring resistivity at three locations consisting of the center of the wafer, a location at the midpoint between the wafer center and outer periphery, and a location 5 mm from the wafer outer periphery, selecting the maximum and minimum values from the values for resistivity at those three locations, and entering those values into the equation: (Maximum value−Minimum value)×100/Minimum value.

In addition, in the present invention, "free of grown-in defects" refers to the elimination of all defects having the potential to be formed accompanying crystal growth, such as COP defects and dislocation clusters.

"Light etching defects" refers to defects detected using a light microscope after carrying out Cu decoration in which as-grown silicon single crystal wafers are immersed in an aqueous copper sulfate solution and allowed to air dry, and heat-treated at 900° C. for about 20 minutes, immersing the test piece in an HF/HNO$_3$ mixed solution to removing the surface layer by etching for several tens of microns so as to remove Cu silicate from the surface layer, and carrying out 2 μm of light etching (chromic acid etching) on the wafer surface. According to this evaluation method, by decorating dislocation clusters formed during crystal growth with Cu, the dislocation clusters can be actualized, thereby enabling dislocation clusters to be detected with higher sensitivity. Namely, dislocation clusters are included in light etching defects.

In the present invention, "LPD density" refers to the density of defects detected using a laser scattering type particle counter (SP1 (Surfscan SP1): KLA-Tencor).

TZDB is the abbreviation for time zero dielectric breakdown, and is one of the indicators used to express GOI. The probability at which electrostatic breakdown does not occur when measuring the current-voltage curve at 229 locations throughout the entire wafer under the conditions of a measuring electrode surface area of 8 mm$^2$ and an evaluation current of 1 mA is defined to be the TZDB pass rate in the present invention. Furthermore, this pass rate is the C mode pass rate.

According to the silicon single crystal wafer of the present invention, since COP defects and dislocation clusters are eliminated throughout the entire region in the radial direction of the crystal, it is suitable for IGBT in which wafers are used in the vertical direction. Namely, since COP defects and dislocation clusters are eliminated throughout the entire region in the radial direction of the crystal, COP defects are not incorporated in the gate oxide film and there is no deterioration of GOI during formation of the gate oxide film on the wafer surface in the IGBT production process. In addition, as a result of dislocation clusters being eliminated, leakage current can be prevented in integrated circuits.

Moreover, since the interstitial oxygen concentration is $8.5 \times 10^{17}$ atoms/cm$^3$ or less, the concentration of oxygen donors generated after a wafer heat treatment can be held to $9.8 \times 10^{12}$ donors/cm³ or less, thereby making it possible to prevent changes in resistivity of the wafer before and after the heat treatment and stabilize the quality of the silicon single crystal wafer.

Figure 1:
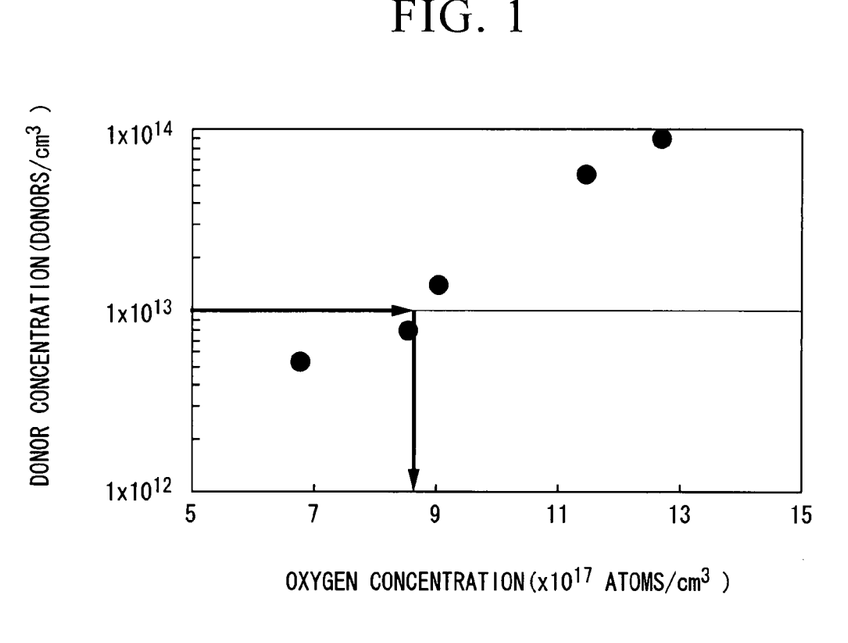
FIG. 1 is a graph showing the relationship between interstitial oxygen concentration and oxygen donor concentration after a heat treatment.

Furthermore, the reason for making the concentration of oxygen donors to be $9.8 \times 10^{12}$ donors/cm³ or less is as follows. N-type wafers having resistivity of 40 to 70 Ω·cm are used in high-withstand-voltage IGBT. For example, in the case where the resistivity specifications of a wafer are 45 to 55 Ω·cm, the allowable donor concentration is $9.8 \times 10^{12}$ donors/cm³ or less. Here, the temperature at which oxygen donors originating in oxygen are most easily generated is 450° C. For example, sintering of Al wires in a device process is carried out at roughly this temperature. The results of investigating the oxygen concentration dependency of the concentration of oxygen donors generated in the case of carrying out heat treatment at 450° C. for 1 hour are shown in FIG. 1. According to FIG. 1, in order to hold the oxygen donor concentration to $9.8 \times 10^{12}$ donors/cm³ or less, it can be seen that the interstitial oxygen concentration of the wafer must be controlled to $8.5 \times 10^{17}$ atoms/cm³ or less. For this reason, in the present invention, the interstitial oxygen concentration was made to be $8.5 \times 10^{17}$ atoms/cm³ or less.

Furthermore, since there are cases when using an ordinary CZ method in which it is difficult to lower the interstitial oxygen concentration to $8.5 \times 10^{17}$ atoms/cm³ or less, it is possible to lower the interstitial oxygen concentration to $8.5 \times 10^{17}$ atoms/cm³ or less by using the MCZ method in which single crystals are grown by applying a magnetic field. Also the interstitial oxygen concentration can be lowered by lowering a rotation speed of a quartz crucible.

According to the silicon single crystal wafer of the present invention, since the variation in resistivity within the wafer surface is 5% or less, stable IGBT quality can be achieved.

Although the resistivity of silicon single crystal wafers produced by the CZ method can be controlled according to the amount of dopant contained in the silicon single crystal, since phosphorous, which is frequently used as a dopant of wafers for IGBT, has a small segregation coefficient, its concentration changes considerably along the lengthwise direction of the silicon single crystal. Consequently, the range over which wafers are obtained having resistivity that complies with design specifications is narrow within a given single crystal. Consequently, in the present invention, neutron irradiation, addition of n-type dopant to the silicon melt, addition of a predetermined amount of p-type dopant having a smaller segregation coefficient than that of phosphorous and various other means are employed as previously described. In any case, it is important to use silicon polycrystals having a low impurity concentration for the raw materials, and grow single crystals using a synthetic quartz crucible that is less likely to elute impurities. The use of these means makes it possible to improve the yield of silicon single crystals.

With respect to neutron irradiation, silicon single crystals are first grown without adding a dopant to the silicon melt for the purpose of adjusting resistivity, and as a result of irradiating these non-doped single crystals with neutrons, phosphorous can be doped by utilizing the phenomenon by which $^{30}$Si in the crystals is converted to $^{31}$P. Since $^{30}$Si is uniformly contained at a concentration of about 3% in single crystals, neutron irradiation enables phosphorous to be doped with the greatest uniformity in the radial and axial directions of the crystal.

In addition, resistivity can also be controlled by adding an n-type dopant to the silicon melt. At this time, it is preferable to use the so-called Double-Layered Czochralski method (DLCZ method). The DLCZ method refers to a method for inhibiting concentration changes in the crystal axial direction of dopants having a small segregation coefficient such as phosphorous. This method is disclosed in, for example, Japanese Unexamined Patent Application, First Publication No. H5-43384, and consists of adding phosphorous after first temporarily melting all of the polycrystalline silicon in the crucible to form a silicon melt as in the CZ method, lowering the temperature at the bottom of the crucible to solidify the silicon melt from the bottom towards the top and form a silicon solidified layer, and growing crystals while gradually melting this silicon solidified layer from the top towards the bottom so as to keep the concentration of dopant incorporated in the single crystals nearly constant.

In the present invention, changes in resistivity in the axial direction of silicon single crystals can be inhibited by employing this DLCZ method as well.

Figure 2:
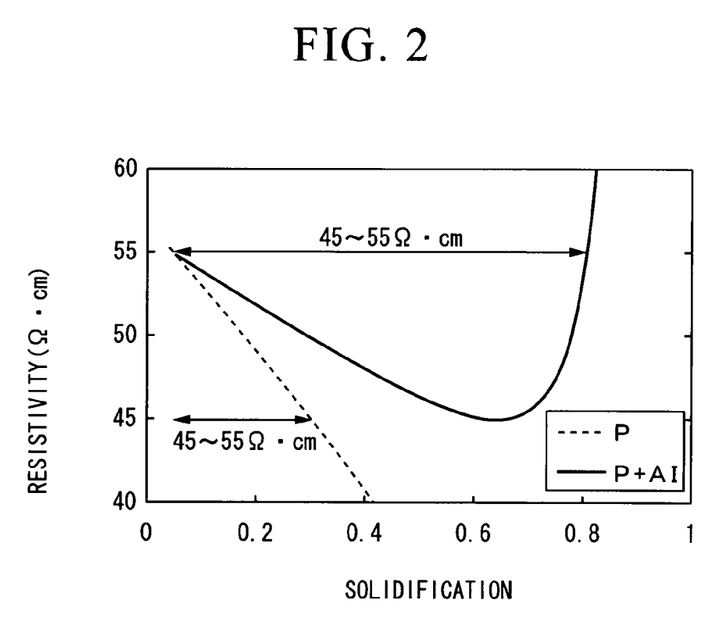
FIG. 2 is a graph showing the relationship between solidification rate and resistivity.

Changes in resistivity in the axial direction of silicon single crystals can also be inhibited by the addition of a predetermined amount of a p-type dopant having a segregation coefficient smaller than that of phosphorous. This is referred to as so-called double doping, is disclosed in, for example, Japanese Unexamined Patent Application, First Publication No. 2002-128591, and is employed to inhibit changes in resistivity in the axial direction of crystals doped with a dopant having a small segregation coefficient in the manner of phosphorous. Changes in concentration attributable to phosphorous can be compensated by doping the phosphorous with a counter dopant in the form of a p-type dopant (e.g., Al, Ga, In) having a smaller segregation coefficient than that of phosphorous. Changes in resistivity in the crystal axial direction in the case of doping with phosphorous only and the case of simultaneously doping with phosphorous and aluminum are shown in FIG. 2. In the case of wafer resistivity specifications of 45 to 55 Ω·cm, yield improves roughly three-fold as a result of simultaneously doping with phosphorous and aluminum. Yield becomes even higher by making the concentration ratio of aluminum to phosphorous at the upper edge of the single crystals about 50%. In the present invention, changes in resistivity in the axial direction of silicon single crystals can be inhibited by containing phosphorous and a p-type dopant having a smaller segregation coefficient than that of phosphorous at concentrations of $1 \times 10^{13}$ atoms/cm³ to $1 \times 10^{15}$ atoms/cm³, respectively.

Moreover, in the present invention, a method referred to as the so-called CCZ method can also be applied. This method is disclosed in, for example, Japanese Unexamined Patent Application, First Publication No. S61-36197, and consists of adding polycrystalline silicon not containing a dopant to a silicon melt containing phosphorous during single crystal growth to keep the concentration of dopant incorporated in the single crystals nearly constant.

In addition, in the case of growing single crystals by adding a dopant to a silicon melt as in the DLCZ method or CCZ method, it is preferable to rotate at a high crystal rotating speed during crystal growth to inhibit variations in resistivity within the wafer surface, and a crystal rotating speed within the range of 15 to 30 rpm is preferable in the case of growing single crystals having a diameter of 200 mm or less, while a crystal rotating speed within the range of 8 to 15 rpm is preferable for a diameter of 300 mm or more. Furthermore, ordinarily when the crystal rotating speed is increased, the margin of the pulling speed for obtaining crystals free of grown-in defects ends up becoming narrower, thereby making it difficult to grow single crystals. In the present invention however, as a result of growing silicon single crystals in a gaseous atmosphere containing hydrogen, an adequately large margin can be secured for the pulling speed for obtaining crystals free of grown-in defects.

Next, COP defects and dislocation clusters can be easily eliminated by doping silicon single crystals with $1\times10^{14}$ to $5\times10^{15}$ atoms/cm$^3$ of nitrogen. If the amount of doped nitrogen is less than $1\times10^{14}$ atoms/cm$^3$, there is the risk of COP defects and dislocation clusters not being completely eliminated, while if the amount of doped nitrogen exceeds $5\times10^{15}$ atoms/cm$^3$, nitrides form which end up preventing the growth of silicon single crystals.

In addition, according to the silicon single crystal wafer of the present invention, since the TZDB pass rate is 90% or more, the concentration of oxygen donors generated in the case of carrying out heat treatment at 450° C. for 1 hour is $6\times10^{12}$ donors/cm$^3$ or less, the density of BMD formed in the case of carrying out two-stage heat treatment including heating at 800° C. for 4 hours and heating at 1000° C. for 16 hours is $5\times10^7$ cm$^{-3}$ or less, and the recombination lifetime in the case of carrying out the same two-stage heat treatment is 100 μsec or more, it is able to satisfy the characteristics required of silicon single crystal wafers for IGBT.

Recombination lifetime deteriorates due to precipitation in the form of SiO$_2$ as the interstitial oxygen contained in silicon single crystals goes through the device formation process. According to the wafer of the present invention, since the interstitial oxygen concentration is $8.5\times10^{17}$ atoms/cm$^3$ or less as described above, the recombination lifetime can be made to be 100 μsec or more.

Next, a first aspect of the method for manufacturing a silicon single crystal wafer for IGBT of the present invention which is obtained by growing a silicon single crystal by the Czochralski method, includes: introducing a hydrogen atom-containing substance into the atmospheric gas in a CZ furnace at a hydrogen gas equivalent partial pressure of 40 to 400 Pa, growing a single crystal having an interstitial oxygen concentration of $8.5\times10^{17}$ atoms/cm$^3$ or less at a silicon single crystal pulling speed enabling pulling of a silicon single crystal free of grown-in defects, and irradiating the pulled silicon single crystal with neutrons so as to dope with phosphorous.

A second aspect of the method for manufacturing a silicon single crystal wafer for IGBT of the present invention which is obtained by growing a silicon single crystal by the Czochralski method, includes: adding an n-type dopant to a silicon melt, introducing a hydrogen atom-containing substance into the atmospheric gas in a CZ furnace at a hydrogen gas equivalent partial pressure of 40 to 400 Pa, and growing a single crystal having an interstitial oxygen concentration of $8.5\times10^{17}$ atoms/cm$^3$ or less at a silicon single crystal pulling speed enabling pulling of a silicon single crystal free of grown-in defects.

A third aspect of the method for manufacturing a silicon single crystal wafer for IGBT of the present invention which is obtained by growing a silicon single crystal by the Czochralski method, includes: adding phosphorous to a silicon melt so that the phosphorous concentration in the silicon single crystal is $2.9\times10^{13}$ to $2.9\times10^{15}$ atoms/cm$^3$, adding a p-type dopant having a segregation coefficient smaller than that of the phosphorous to the silicon melt so that the concentration in the silicon single crystal is $1\times10^{13}$ to $1\times10^{15}$ atoms/cm$^3$ corresponding to the segregation coefficient thereof, introducing a hydrogen atom-containing substance into the atmospheric gas in a CZ furnace at a hydrogen gas equivalent partial pressure of 40 to 400 Pa, and growing the single crystal having an interstitial oxygen concentration of $8.5\times10^{17}$ atoms/cm$^3$ or less at a silicon single crystal pulling speed enabling pulling of a silicon single crystal free of grown-in defects.

In the first to third aspects of the method for manufacturing a silicon single crystal wafer for IGBT of the present invention, nitrogen may be added to the silicon melt so that the nitrogen concentration in the silicon single crystal is $1\times10^{14}$ to $5\times10^{15}$ atoms/cm$^3$.

Here, a hydrogen-containing substance refers to a substance containing hydrogen atom in its molecule, and the substance is a gaseous substance that generates hydrogen gas as a result of thermal decomposition when melted in a silicon melt. Hydrogen gas itself is included in this hydrogen-containing substance. The hydrogen concentration in a silicon melt can be increased by mixing this hydrogen-containing substance with an inert gas and introducing into the atmosphere during formation of a necked portion. Although specific examples of the hydrogen-containing substances include hydrogen gas, inorganic compounds containing hydrogen atoms such as H$_2$O or HCl, silane gas, hydrocarbons such as CH$_4$ or C$_2$H$_2$, and organic compounds containing hydrogen atoms such as alcohols or carboxylic acids, hydrogen gas is used particularly preferably. In addition, inexpensive Ar gas is preferable for the atmospheric gas in the CZ furnace, while various types of other noble gases such as He, Ne, Kr or Xe gas, or mixed gases thereof, can also be used.

In addition, in the present invention, the concentration of the hydrogen-containing substance in the hydrogen-containing atmosphere is within the range of a hydrogen gas equivalent partial pressure of 40 to 400 Pa. Here, the reason for using the hydrogen gas equivalent partial pressure is because the amount of hydrogen atoms obtained by thermal decomposition and so forth of the hydrogen-containing substance is affected by the number of hydrogen atoms originally contained in the hydrogen-containing substance. For example, although 1 mole of H$_2$ is contained in 1 mole of H$_2$O, only 0.5 moles of H$_2$ are contained in 1 mole of HCl. In the present invention, an atmosphere in which hydrogen gas is introduced into an inert gas at a partial pressure of 40 to 400 Pa is served as a standard, and it is preferable to determine the concentration of the hydrogen-containing substance so as to obtain an atmosphere equivalent to the standard atmosphere, and the preferable pressure of the hydrogen-containing substance at this time is defined using the hydrogen gas equivalent partial pressure.

Namely, in the present invention, based no the assumption that the hydrogen-containing substance melts in the silicon melt and is converted to hydrogen atoms by thermal decomposition in the high-temperature silicon melt, the amount of the hydrogen-containing substance added should be adjusted so that the hydrogen gas equivalent partial pressure in the atmosphere after conversion is within the range of 40 to 400 Pa.

According to the method for manufacturing a silicon single crystal wafer for IGBT as described above, the tolerance of the rate that allows silicon single crystals to be pulled that are free of grown-in defects can be increased by introducing a hydrogen atom-containing substance within a hydrogen gas equivalent partial pressure of 40 to 400 Pa, and as a result, wafers can be easily produced from which COP defects and dislocation clusters are eliminated throughout the entire region in the radial direction of the crystal. In addition, by either doping irradiating non-doped silicon single crystals with neutrons and doping with phosphorous after pulling, or adding an n-type dopant such as phosphorous to the silicon melt, variation in resistivity within the crystal surface can be made to be 5% or less. In addition, a reduction in variation in resistivity can also be achieved by adding phosphorous and a p-type dopant having a smaller segregation coefficient than that of phosphorous to the silicon melt.

The addition of nitrogen to the silicon melt makes it possible to increase the tolerance of the pulling speed at which silicon single crystals free of grown-in defects can be pulled, thereby facilitating the elimination of COP defects and dislocation clusters from wafers.

According to the present invention, a method for manufacturing a silicon single crystal for IGBT and a silicon single crystal for IGBT can be provided which, in addition to allowing an increase in the margin of pulling speed, enable wafers to be produced that have little variation in resistivity.

PREFERRED EMBODIMENTS

The following provides an explanation of embodiments of the present invention with reference to the drawings.

(Constitution of CZ Furnace)

Figure 3:
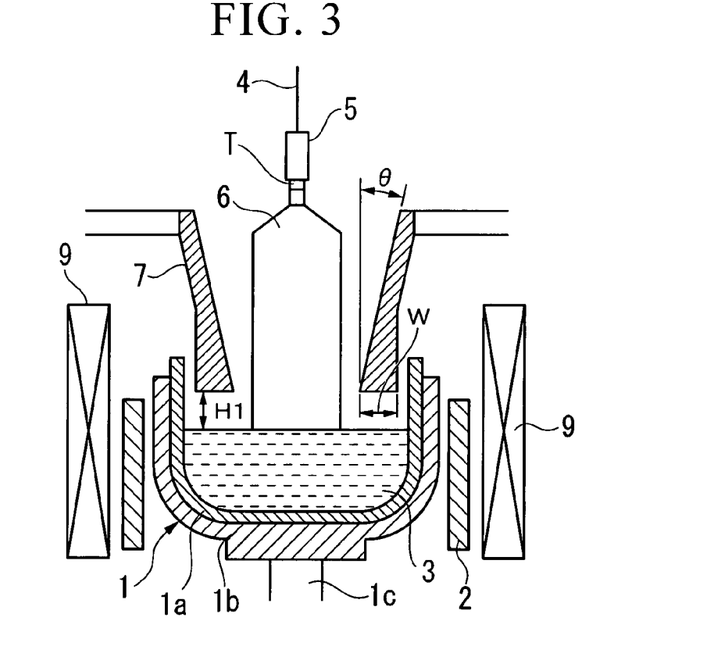
FIG. 3 is longitudinal cross-sectional schematic drawing of a CZ furnace used when carrying out a method for manufacturing a silicon single crystal wafer of an embodiment of the present invention.

FIG. 3 is a longitudinal cross-sectional view of a CZ furnace suitable for carrying out the method for manufacturing a silicon single crystal wafer for IGBT in an embodiment of the present invention.

The CZ furnace shown in FIG. 3 is provided with a crucible 1 arranged in the center of a chamber, a heater 2 arranged outside the crucible 1, and a magnetic field generator 9 arranged outside the heater 2. The crucible 1 has a double-wall structure that includes a quartz crucible 1a containing a silicon melt 3 on the inside and a graphite crucible 1b on the outside retaining the quartz crucible 1a, and is rotated and raised and lowered by a support shaft 1c referred to as a pedestal.

A cylindrical heat shield 7 is provided above the crucible 1. This heat shield 7 has a structure consisting of an outer shell made of graphite with graphite felt filled inside. The inner surface of the heat shield 7 is tapered such that the inner diameter gradually decreases from the upper end to the lower end. The upper outer surface of the heat shield 7 is tapered corresponding to the inner surface, while the lower outer surface is formed to a nearly straight surface so that the thickness of the heat shield 7 gradually increases towards the lower end.

A silicon single crystal 6 can be formed by immersing a seed crystal T attached to a seed chuck 5 in the silicon melt 3 and pulling up the seed crystal T while rotating the crucible 1 and a pulling shaft 4.

The heat shield 7 blocks radiant heat from the heater 2 and the surface of the silicon melt 3 to the lateral surface of the silicon single crystal 6, and surrounds the lateral surface of the silicon single crystal 6 being grown as well as the surface of the silicon melt 3. An example of the specifications of the heat shield 7 is as follows: width W of the lower end portion of the heat shield 7 in the radial direction of, for example, 50 mm, inclination θ of the inner surface in the form of an inverted truncated cone relative to the perpendicular direction of, for example 21°, and height H1 from the melt surface to the lower end of the heat shield 7 of, for example, 60 mm.

In addition, a horizontal magnetic field or a cusped magnetic field and so forth can be used for the magnetic field supplied from the magnetic field generator 9, and for example, the intensity of a horizontal magnetic field is 2000 to 4000 G (0.2 to 0.4 T), and preferably 2500 to 3500 G (0.25 to 0.35 T), while the height of the center of the magnetic field is set to be within the range of −150 to +100 mm, and preferably −75 to +50 mm, relative to the melt surface.

(Method for Manufacturing a Silicon Single Crystal Wafer for IGBT)

The following provides an explanation of a method for manufacturing a silicon single crystal wafer for IGBT using the CZ furnace shown in FIG. 3.

First, 300 kg, for example, of highly pure polycrystalline silicon are placed in the crucible 1, and a silicon wafer is added having a CVD film including silicon nitride, for example, as a nitrogen source. The nitrogen concentration in the silicon melt is preferably adjusted so that the nitrogen concentration in the silicon crystal is $1 \times 10^{14}$ to $5 \times 10^{15}$ atoms/cm$^3$.

Next, a hydrogen-containing atmosphere is prepared in the CZ furnace composed of a mixed gas of a hydrogen-containing substance and an inert gas, the atmospheric pressure is set to be 1.3 to 13.3 kPa (10 to 100 torr), and the concentration of the hydrogen-containing substance in the atmospheric gas is adjusted to about 40 to 400 Pa as the hydrogen gas equivalent partial pressure. In the case of selecting hydrogen gas for the hydrogen-containing substance, the hydrogen gas equivalent partial pressure should be 40 to 400 Pa. The concentration of hydrogen gas at this time is within the range of 0.3 to 31%.

If the hydrogen gas equivalent partial pressure of the hydrogen-containing substance is less than 40 Pa, the tolerance of the pulling speed decreases, which is not desirable since it is no longer possible to inhibit the formation of COP defects and dislocation clusters. In addition, the higher the hydrogen gas equivalent concentration of the hydrogen-containing substance (hydrogen concentration), the greater the effect of inhibiting the occurrence of dislocation.

However, if the hydrogen gas equivalent partial pressure exceeds 400 Pa, the risk of an explosion in the case of leakage of oxygen into the CZ furnace increases, thereby making this undesirable in terms of safety. More preferably, the hydrogen gas equivalent partial pressure of the hydrogen-containing substance is within the range of 40 to 250 Pa, and particularly preferably within the range of 40 to 135 Pa.

Next, together with supplying a horizontal magnetic field of, for example, 3000 G (0.3 T) from the magnetic field generator 9 at a height of the center of the magnetic field of −75 to +50 mm relative to the melt surface, the polycrystalline silicon is heated by the heater 2 to form the silicon melt 3.

Next, the seed crystal T attached to the seed chuck 5 is immersed in the silicon melt 3, and crystal pulling is carried out while rotating the crucible 1 and the pulling shaft 4. An example of the pulling conditions in this case includes controlling the ratio V/G, wherein the single crystal growth rate is defined as V (mm/min) and the temperature gradient from the melting point to 1350° C. during single crystal growth is defined as G (° C./mm), to about 0.22 to 0.15, and controlling V to 0.42 to 0.33 mm/min as the silicon single crystal pulling speed enabling pulling of silicon single crystals free of grown-in defects. In addition, examples of other conditions include a quartz crucible rotating speed of 5 to 0.2 rpm, a single crystal rotating speed of 20 to 10 rpm, an argon atmospheric pressure of 30 torr, and a magnetic field intensity of 3000 G In particular, diffusion of oxygen atoms contained in the quartz crucible into the silicon melt can be prevented by making the quartz crucible rotating speed 5 rpm or less, thereby making it possible to reduce the interstitial oxygen concentration in the silicon single crystals. In addition, variations in resistivity within the silicon single crystals can be reduced by making the single crystal rotating speed 15 rpm or more.

As a result of setting the crystal pulling conditions to those described above, the interstitial oxygen concentration in the silicon single crystals can be made to be $8.5 \times 10^{17}$ atoms/cm$^3$ or less, thereby making it possible to prevent the generation of oxygen donors in the IGBT production process. If the interstitial oxygen concentration exceeds $8.5 \times 10^{17}$ atoms/cm$^3$, oxygen donors end up being generated in the IGBT production process that cause changes in the characteristics of the IGBT, thereby making this undesirable.

Next, the formed single crystal silicon not containing a dopant for adjusting resistivity is irradiated with neutrons. As a result of this neutron irradiation, a portion of the silicon atoms are converted to phosphorous, thereby enabling the single crystal silicon to be uniformly doped with phosphorous and allowing the obtaining of single crystal silicon having uniform resistivity. The conditions for neutron irradiation include, for example, irradiating for about 80 hours at a crystal rotating speed of about 2 rpm at the location where the neutron flux is $3.0 \times 10^{12}$ neutrons/cm$^2$/s. The silicon ingot irradiated with neutrons in this manner has a resistivity of about 48 to 52 Ω·cm.

Although an n-type dopant (such as P, As or Sb) may be preliminarily added to the silicon melt instead of irradiating with neutrons, resistivity changes drastically in the lengthwise direction of the silicon single crystals due to the small segregation coefficient. In order to prevent this change in the concentration of the n-type dopant, a method such as the previously described DLCZ method, double doping method or CCZ method is employed. Moreover, the crystal rotating speed during single crystal growth may be 15 rpm or more in order to inhibit variation in resistivity within the wafer surface.

Next, a wafer is cut out from the silicon single crystal, and then is subjected to lapping or etching as necessary, and RTA heat treatment may also be carried out as necessary.

Figure 4:
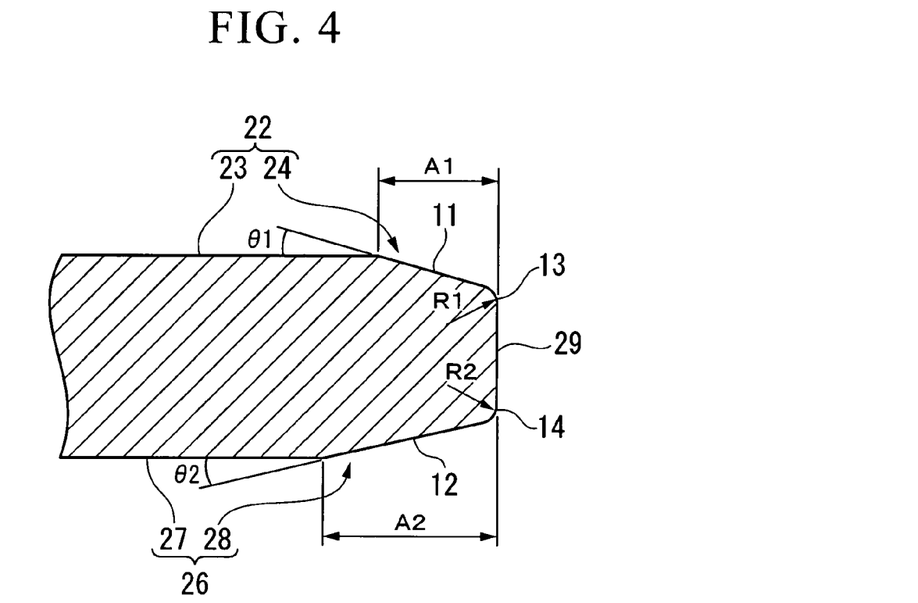
FIG. 4 is a cross-sectional schematic drawing showing the outer peripheral portion of a silicon single crystal wafer of an embodiment of the present invention.

When carrying out lapping, in addition to forming a beveled portion on the front surface of the outer peripheral portion of the wafer surface, it is preferable to form a beveled portion on the rear surface of the outer peripheral portion of the wafer so as to prevent cracking of the wafer. FIG. 4 shows a cross-sectional view of the outer peripheral portion of a wafer after completion of wafer machining.

As shown in FIG. 4, a primary surface 23 which is a flat surface and a front surface beveled portion 24 formed on the outer peripheral portion are provided in a front surface 22 of the wafer. In addition, a flat surface which is a primary surface 27 and a rear surface beveled portion 28 formed on the outer peripheral portion are provided in a rear surface 26. The front surface beveled portion 24 is such that a width A1 in the direction towards the inside in the radial direction of the wafer from an outer peripheral portion 29 is narrower than a width A2 in the direction towards the inside in the radial direction of the wafer from the outer peripheral portion 29 of the rear surface beveled portion 28. The width A1 of the front surface beveled portion 24 is preferably within the range of 50 to 200 µm. In addition, the width A2 of the rear surface beveled portion 28 is preferably within the range of 200 to 300 µm.

In addition, the front surface beveled portion 24 has a first incline 11 inclined relative to the primary surface 23 of the front surface 22, while rear surface beveled portion 28 has a second incline 12 inclined relative to the primary surface 27 of the rear surface 26. The angle of inclination θ1 of the first incline is preferably within the range of 10 to 50°, while the angle of inclination θ2 of the second incline is preferably within the range of 10 to 30°, and preferably θ1≥θ2.

In addition, a first curve 13 is provided between the first incline 11 and the outer peripheral portion 29 that connects the two. In addition, a second curve 14 is provided between the second incline 12 and the outer peripheral portion 29 that connects the two. The range of the radius of curvature R1 of the first curve 13 is preferably 80 to 250 µm, while the range of the radius of curvature R2 of the second curve 14 is preferably 100 to 300 µm.

Next, a polysilicon layer is formed on one side of the wafer. Since the interstitial oxygen concentration is extremely low, the silicon single crystal wafer of the present embodiment cannot be expected to demonstrate gettering effects attributable to oxygen precipitates. Consequently, it is necessary to form a gettering layer in the form of a polycrystalline silicon layer on the rear side to remove heavy metal contamination in the IGBT production process. In addition, the formation of the polycrystalline silicon layer on the rear side prevents the occurrence of slipping, thereby making it possible to prevent the propagation of slipping to the front surface of the wafer before it occurs. The thickness of the polycrystalline silicon layer is preferably 50 nm to 2000 nm. If the thickness is 50 nm or more, both gettering effects and inhibitory effects on the occurrence of slipping can be adequately demonstrated, while if the thickness is 2000 nm or less, wafer warping can be prevented.

Thus, a silicon single crystal wafer for IGBT of the present embodiment can be produced in this manner.

According to the above-mentioned production process, the tolerance of the speed at which silicon single crystals can be pulled that are free of grown-in defects can be increased by introducing a hydrogen atom-containing substance at a hydrogen gas equivalent partial pressure within the range of 40 to 400 Pa, and as a result, a wafer can be easily produced in which COP defects and dislocation clusters are eliminated throughout the entire region in the radial direction of the crystal. In addition, variations in resistivity within the wafer surface can be reduced to 5% or less by doping a pulled silicon single crystal with phosphorous after neutron irradiation, or by adding an n-type dopant such as phosphorous to the silicon melt. Reduction in resistivity variations can also be achieved by adding phosphorous and a p-type dopant having a smaller segregation coefficient than that of phosphorous to the silicon melt.

In addition, the tolerance of the pulling speed at which silicon single crystals can be pulled that are free of grown-in defects can be further increased by adding nitrogen to the silicon melt, thereby facilitating the elimination of COP defects and dislocation clusters from the wafer.

(Silicon Single Crystal Wafer for IGBT)

In the silicon single crystal wafer produced in the manner described above, COP defects and dislocation clusters are eliminated throughout the entire region in the radial direction of the crystal, an interstitial oxygen concentration is $8.5 \times 10^{17}$ atoms/cm$^3$ or less, and variation in resistivity within the wafer surface is 5% or less. In addition, the resistivity itself is about 48 to 52 Ω·cm. Moreover, the silicon single crystal wafer is doped with $1 \times 10^{14}$ to $5 \times 10^{15}$ atoms/cm$^3$ or less of nitrogen.

Moreover, the TZDB pass rate in a disruptive magnetic field of 8 MV/cm of the silicon single crystal wafer of the present embodiment is 90% or more, and the concentration of oxygen donors precipitating in the case of heat treatment at 450° C. for 1 hour is $6\times10^{12}$ donors/cm$^3$ or less, the density of BMD forming in the case of carrying out two-stage heat treatment including heating at 800° C. for 4 hours and heating at 1000° C. for 16 hours is $5\times10^7$ cm$^{-3}$ or less, and the recombination lifetime in the case of carrying out the same two-stage heat treatment is 100 µsec or more.

In addition, the density of LPD on the wafer surface in the silicon single crystal wafer of the present embodiment is 0.1 defect/cm$^2$ or less, and the light etching defect density is $1\times10^3$ defects/cm$^2$ or less. Moreover, a polycrystalline silicon layer of 50 to 2000 nm is formed on the rear surface of the silicon single crystal wafer of the present embodiment, a front surface beveled portion is formed on the outer peripheral portion of the front surface of the wafer, and a rear surface beveled portion is formed on the outer peripheral portion of the rear surface of the wafer.

According to the silicon single crystal wafer for IGBT of the present embodiment, since COP defects and dislocation clusters are eliminated from the entire region in the radial direction of the crystal, COP defects are not incorporated in the gate oxide film and there is no deterioration of GOI when forming a gate oxide film on the wafer surface in the IGBT production process.

Moreover, as a result of eliminating COP defects and dislocation clusters from the entire region in the radial direction of the crystal, the single crystal silicon wafer for IGBT of the present embodiment can be suitably used as a wafer for an IGBT, which is a device that uses wafers in the vertical direction. Namely, since COP defects and dislocation clusters are eliminated, the wafer has superior bulk quality, and recombination lifetime, which is an important characteristic of wafers for IGBT, can be improved.

Moreover, since the interstitial oxygen density is $8.5\times10^{17}$ atoms/cm$^3$ or less, the concentration of oxygen donors generated after heat treatment of the wafer can be held to $9.8\times10^{12}$ donors/cm$^3$ or less, thereby making it possible to prevent changes in resistivity of the wafer before and after the heat treatment, and making it possible to stabilize the quality of the silicon single crystal wafer.

In addition, according to the silicon single crystal wafer of the present invention, since variations in resistivity within the wafer surface are 5% or less, the quality of the silicon single crystal wafer can be stabilized.

Moreover, as a result of doping the silicon single crystal with nitrogen at $1\times10^{14}$ to $5\times10^{15}$ atoms/cm$^3$, COP defects and dislocation clusters are easily eliminated. If the amount of doped nitrogen is less than $1\times10^{14}$ atoms/cm$^3$, there is the risk of the COP defects and dislocation clusters not being completely eliminated, while if the amount of doped nitrogen exceeds $5\times10^{15}$ atoms/cm$^3$, nitrides end up forming that prevent silicon single crystal growth.

In addition, since the TZDB pass rate is 90% or more, the concentration of oxygen donors generated in the case of carrying out heat treatment at 450° C. for 1 hour is $6\times10^{12}$ donors/cm$^3$ or less, the density of BMD precipitating in the case of carrying out two-stage heat treatment including heating at 800° C. for 4 hours and heating at 1000° C. for 16 hours is $5\times10^7$ cm$^{-3}$ or less, and the recombination lifetime in the case of carrying out the same two-stage heat treatment is 100 µsec or more, those characteristics required of silicon single crystal wafers for IGBT can be satisfied.

EXAMPLES

Experimental Example 1

Silicon ingots having various interstitial oxygen concentrations were produced by the CZ method. More specifically, polycrystalline silicon chunks were placed in a quartz crucible and then the polycrystalline silicon chunks are heated in an argon atmosphere to obtain a silicon melt. Phosphorous as a dopant was added to this silicon melt. The amount of phosphorous added was adjusted such that the resistivity of the silicon single crystal was 65 Ω·cm. Next, a seed crystal was immersed in the silicon melt while supplying a horizontal magnetic field of 3000 G (0.3 T) from a magnetic field generator such that the height of the center of the magnetic field was −75 to +50 mm from the surface of the silicone melt, after which the seed crystal and the quartz crucible were rotated while growing single crystals from the bottom of the seed crystal by gradually pulling the seed crystal. Furthermore, the ratio V/G, wherein the single crystal growth rate (pulling speed) is defined as V (mm/min) and the temperature gradient from the melting point to 1350° C. during single crystal growth is defined as G (° C./mm), was set to about 0.185, and V was set to 0.49 mm/min. Silicon single crystal ingots were thus produced by pulling under the Conditions 1 to 4. The interstitial oxygen concentrations of the silicon ingots were controlled by adjusting the rotating speed of the quartz crucible. In addition, in the case of Condition 4, the silicon single crystals were doped with nitrogen at $4.1\times10^{14}$ atoms/cm$^3$ by adding a silicon wafer having a silicon nitride film into the silicon melt.

Next, the pulled silicon single crystal ingots were sliced to cut out wafers. The cut-out wafers were subjected to surface treatment such as lapping and etching. In this manner, silicon single crystal wafers were produced having a diameter of 200 mm and thickness of 0.75 mm.

The resulting silicon single crystal wafers were measured for interstitial oxygen concentration and evaluated for variations in resistivity within the wafer surface. Interstitial oxygen concentration was measured in compliance with the Fourier transform infrared spectrophotometry method defined in ASTM F-121 (1979). Variations in resistivity were determined by measuring the resistivity at a total of three locations consisting of a wafer center, an intermediate location between the wafer center and an outer peripheral portion, and a location 5 mm from the wafer outer peripheral portion, selecting the maximum and minimum values among the resistivity values at the three locations, and calculating the resistivity using the following equation: (Maximum value−Minimum value)×100/ZMinimum value. Those results are shown in Table 1.

Table 1 also indicates the tolerances of pulling speed. This tolerance indicates the margin of pulling speed enabling elimination of COP defects and dislocation clusters through the entire region in the radial direction of the crystal which was determined by gradually lowering the crystal pulling speed, vertically cracking the grown crystals in the direction of growth, observing the distribution of grown-in defects after Cu decoration by X-ray topography to evaluate the COP defect region and measuring light etching defects to evaluate the dislocation cluster region.

TABLE 1

| Pulling Conditions | Crucible Rotating Speed (rpm) | Crystal Rotating Speed (rpm) | Oxygen concentration (atoms/cm³) | Variation in resistivity (%) | Pulling Speed Tolerance (mm/min) | Comments |
|---|---|---|---|---|---|---|
| Condition 1 | 7 | 13 | $10.4 \times 10^{17}$ | 10 | 0.025 | Comparative Example |
| Condition 2 | 1 | 13 | $6.3 \times 10^{17}$ | 11 | 0.027 | Comparative Example |
| Condition 3 | 1 | 20 | $5.1 \times 10^{17}$ | 4 | 0.002 | Comparative Example |
| Condition 4 | 1 | 20 | $5.3 \times 10^{17}$ | 7 | 0.018 | Comparative Example |

As shown in Table 1, interstitial oxygen concentration was actually determined to be able to be decreased by lowering the crucible rotating speed from 7 rpm to 1 rpm (Condition 1→Conditions 2 to 4). However, under Conditions 1 and 2, although the tolerance of the pulling speed was able be increased to a certain degree due to the low crystal rotating speed, variations in resistivity were extremely large.

In a comparison of Conditions 2 and 3, although the variation in resistivity was reduced by increasing the crystal rotating speed under Condition 3, the tolerance of the pulling speed decreased considerably. This is believed to be the result of a change in the shape of the solid-liquid interface between the silicon melt and the single crystal caused by an increase in the single crystal rotating speed.

Moreover, although the tolerance of the pulling speed increased as a result of doping with nitrogen under Condition 4 as compared with Condition 3, the variation in resistivity ended up increasing. This is believed to be due to a change in the condition of the convection flow of the silicon melt caused by nitrogen doping.

On the basis of these findings, under the pulling conditions of Conditions 1 to 4, it was difficult to simultaneously decrease interstitial oxygen concentration, reduce variations in resistivity and increase the tolerance of the pulling speed.

Experimental Example 2

Silicon ingots having various interstitial oxygen concentrations were produced by the CZ method. More specifically, polycrystalline silicon chunks were placed in a quartz crucible and then the polycrystalline silicon chunks are heated in an argon atmosphere to obtain a silicon melt. Next, a seed crystal was immersed in the silicon melt while supplying a horizontal magnetic field of 3000 G (0.3 T) from a magnetic field generator such that the height of the center of the magnetic field was −75 to +50 mm from the surface of the silicone melt, after which the seed crystal and quartz crucible were rotated while growing single crystals from the bottom of the seed crystal by gradually pulling the seed crystal. Furthermore, the ratio V/G, wherein the single crystal growth rate (pulling speed) is defined as V (mm/min) and the temperature gradient from the melting point to 1350° C. during single crystal growth is defined as G (° C./mm), was set to about 0.185, and V was set to 0.49 mm/min. Silicon single crystal ingots were thus produced by pulling under the Conditions 5 to 14.

The rotating speed of the quartz crucible was 2 rpm under all conditions, and the rotating speed of the single crystal was 20 rpm under all conditions. Under Conditions 5 and 6, the silicon single crystals were doped with nitrogen by adding a silicon wafer having a silicon nitride film into the silicon melt. Under Conditions 7 to 11, the single crystals were pulled under conditions of a hydrogen partial pressure of 30 to 400 Pa by introducing hydrogen gas into the argon gas atmosphere. Under Conditions 12 to 14, nitrogen doping and introduction of hydrogen gas were carried out simultaneously. Under Conditions 7 to 10 and 12 to 13, resistivity was adjusted by adding phosphorous to the silicon melt, and under the other condition, the silicon single crystal was pulled in the same manner as Experimental Example 1, and was doped with phosphorous by irradiating with neutrons. Neutron beam irradiation was carried out under the conditions of a flux of $3.0 \times 10^{12}$ neutrons/cm²/s and irradiating for 80 hours. In this manner, the resistivity of the silicon single crystals was adjusted to 65 Ω·cm.

Subsequently, the silicon single crystal ingots were sliced to cut out wafers. The cut-out wafers were subjected to surface treatment such as lapping and etching. In this manner, silicon single crystal wafers were produced having a diameter of 200 mm and thickness of 0.75 mm.

The resulting silicon single crystal wafers were measured for interstitial oxygen concentration and evaluated for variations in resistivity within the wafer surface in the same manner as Experimental Example 1. Those results are shown in Table 2. The wafer oxygen concentrations, hydrogen partial pressure in the atmosphere of the CZ furnace, and conditions for introducing a dopant are also shown in Table 2. In addition, the tolerance of pulling speed is also shown in the same manner as Experimental Example 1.

TABLE 2

| Pulling Conditions | Nitrogen Concentration (atoms/cm³) | Hydrogen Partial Pressure (Pa) | Oxygen Concentration (atoms/cm³) | Dopant Introduction | Resistivity Variation | Pulling Speed Tolerance (mm/min) | Comments |
|---|---|---|---|---|---|---|---|
| Condition 5 | $1.6 \times 10^{14}$ | 0 | $6.1 \times 10^{17}$ | Neutron irradiation | 3 | 0.018 | Comparative Example |
| Condition 6 | $9.6 \times 10^{14}$ | 0 | $5.2 \times 10^{17}$ | Neutron irradiation | 3 | 0.021 | Comparative Example |

TABLE 2-continued

| Pulling Conditions | Nitrogen Concentration (atoms/cm³) | Hydrogen Partial Pressure (Pa) | Oxygen Concentration (atoms/cm³) | Dopant Introduction | Resistivity Variation | Pulling Speed Tolerance (mm/min) | Comments |
|---|---|---|---|---|---|---|---|
| Condition 7 | — | 30 | $6.3 \times 10^{17}$ | Addition of P | 4 | 0.010 | Comparative Example |
| Condition 8 | — | 40 | $5.1 \times 10^{17}$ | Addition of P | 3 | 0.031 | Present Invention |
| Condition 9 | — | 260 | $5.8 \times 10^{17}$ | Addition of P | 4 | 0.036 | Present Invention |
| Condition 10 | — | 400 | $5.4 \times 10^{17}$ | Addition of P | 4 | 0.035 | Present Invention |
| Condition 11 | — | 260 | $6.1 \times 10^{17}$ | Neutron irradiation | 3 | 0.037 | Present Invention |
| Condition 12 | $4.2 \times 10^{14}$ | 40 | $6.2 \times 10^{17}$ | Addition of P | 3 | 0.040 | Present Invention |
| Condition 13 | $6.2 \times 10^{14}$ | 260 | $5.2 \times 10^{17}$ | Addition of P | 4 | 0.045 | Present Invention |
| Condition 14 | $6.2 \times 10^{14}$ | 260 | $5.9 \times 10^{17}$ | Neutron irradiation | 3 | 0.046 | Present Invention |

As shown in Tables 1 and 2, although the variation in resistivity that was exacerbated by doping nitrogen according to Condition 4 was improved by doping with phosphorous by irradiating with neutrons as shown in Conditions 5 and 6, the tolerance of the pulling speed was not adequate.

The tolerance of pulling speed, which decreased as a result of increasing the crystal rotating speed under Condition 3, was improved by introducing hydrogen in the atmosphere as shown in Conditions 8 to 10. As a result of introducing a predetermined amount of hydrogen together with controlling the crucible rotating speed and single crystal rotating speed as in Conditions 8 to 10, decreases in resistivity variation and increased pulling speed tolerance were found to be realized simultaneously.

In addition, the variation in resistivity that increased due to nitrogen doping under Condition 4 was improved by introducing hydrogen into the atmosphere as shown in Conditions 12 and 13. This is believed to be the result of being able to control fluctuations in the convection flow state of the silicon melt caused by nitrogen doping. In addition, the pulling speed tolerance was able to be increased under Conditions 12 and 13 as compared with nitrogen doping alone (Conditions 5 and 6) and introduction of hydrogen alone (Conditions 7 to 11).

Moreover, variations in resistivity were able to be further decreased under Condition 14 as compared with Conditions 12 and 13 by carrying out introduction of phosphorous by neutron irradiation.

While preferred embodiments of the invention has been described and illustrated above, it should be understood that these are exemplary of the invention and are not to be considered as limiting. Additions, omissions, substitutions and other modifications can be made without departing from the spirit or scope of the present invention. Accordingly, the invention is not to be considered as being limited by the foregoing description, and is only limited by the scope of the appended claims.

What is claimed is:

1. A silicon single crystal wafer for IGBT comprising a silicon single crystal grown by the Czochralski method, wherein COP defects and dislocation clusters are eliminated from the entire region in the radial direction of the crystal, the interstitial oxygen concentration is $8.5 \times 10^{17}$ atoms/cm³ or less, the silicon single crystal is doped with an n-type dopant and a p-type dopant having a smaller segregation coefficient than that of phosphorous contained at a concentration of $1 \times 10^{13}$ to $1 \times 10^{15}$ atoms/cm³, respectively, and variation in resistivity within the wafer surface is 5% or less.

2. The silicon single crystal wafer for IGBT according to claim 1, wherein the silicon single crystal is grown at a pulling speed that allows pulling of silicon single crystal free of grown-in defects when grown by the Czochralski method, and is doped with phosphorous by carrying out neutron irradiation on the silicon single crystal after pulling.

3. The silicon single crystal wafer for IGBT according to claim 1, wherein the silicon single crystal is grown from a silicon melt doped with phosphorus at a pulling speed enabling pulling of silicon single crystal free of grown-in defects during growth by the Czochralski method.

4. The silicon single crystal wafer for IGBT according to any one of claims 1 to 3, wherein the silicon single crystal is doped with nitrogen at $1 \times 10^{14}$ atoms/cm³ to $5 \times 10^{15}$ atoms/cm³.

5. The silicon single crystal wafer for IGBT according to claim 1, wherein the LPD density in the wafer surface is 1 defect/cm² or less, and the light etching defect density is $1 \times 10^3$ defects/cm² or less.

6. The silicon single crystal wafer for IGBT according to any one of claims 1 to 3, wherein a polycrystalline silicon layer of 50 to 1000 nm is formed on the rear side.

* * * * *